United States Patent

Yanagisawa

[11] Patent Number: 6,066,888
[45] Date of Patent: May 23, 2000

[54] TAPE CARRIER AND TAPE CARRIER DEVICE USING THE SAME

[75] Inventor: Masahiko Yanagisawa, Suwa, Japan

[73] Assignee: Seiko Epson Corporation, Tokyo, Japan

[ * ] Notice: This patent is subject to a terminal disclaimer.

[21] Appl. No.: 09/330,124

[22] Filed: Jun. 11, 1999

Related U.S. Application Data

[63] Continuation of application No. 09/021,844, Feb. 11, 1998, Pat. No. 5,949,134.

[30] Foreign Application Priority Data

Feb. 17, 1997 [JP] Japan ...................................... 9-32472
Oct. 13, 1997 [JP] Japan ..................................... 9-278901

[51] Int. Cl.⁷ .................................................. H01L 23/495
[52] U.S. Cl. ......................... 257/668; 257/670; 257/671; 257/669; 257/673; 257/674; 257/676; 438/123; 438/124
[58] Field of Search ..................................... 257/668, 670, 257/669, 671, 675, 674, 676; 438/123, 124

[56] References Cited

U.S. PATENT DOCUMENTS 5,250,842 10/1993 Ikeda ........................................ 257/668
5,825,081 10/1998 Hosomi et al. .......................... 257/668

FOREIGN PATENT DOCUMENTS

| 465253 | 1/1992 | European Pat. Off. . |
| 62-113459 | 5/1987 | Japan . |
| 63-124433 | 5/1988 | Japan . |
| 4-263446 | 4/1992 | Japan . |
| 04329649 | 11/1992 | Japan . |
| 9-97817 | 4/1997 | Japan . |

*Primary Examiner*—Tom Thomas
*Assistant Examiner*—Luan Thai
*Attorney, Agent, or Firm*—Oliff & Berridge, PLC

[57] ABSTRACT

In a tape carrier, one or a plurality of overhang patterns, each being shorter than a length that reaches an edge of a semiconductor chip, is provided in an area where the pitch between adjacent inner leads is relatively large or in a corner area of the device hole where inner leads are not provided, depending upon the size of such area. An average of resin sealing ranges on the rear surface of the tapes is 0.8 mm and the diversification is 0.06 mm.

20 Claims, 5 Drawing Sheets

| GAP DISTANCE (μm) | 20 | 25 | 30 | 100 | 105 | 110 |
|---|---|---|---|---|---|---|
| EVALUATION | × | △ | ○ | ○ | △ | × |
| DISTANCE FROM DEVICE HOLE END TO MOLD END (mm) | 0.4 | 0.5 | 0.6 | 1.0 | 1.2 | 1.4 |
| STANDARD DEVIATION | 0.08 | 0.07 | 0.05 | 0.07 | 0.1 | 0.12 |

TAPE CARRIER AND TAPE CARRIER DEVICE USING THE SAME

This is a continuation of application Ser. No. 09/021,844 filed Feb. 11, 1998, now U.S. Pat. No. 5,949,134. The entire disclosure of the prior application is hereby incorporated by reference herein in its entirety.

BACKGROUND OF THE INVENTION

1. Field of Invention

The present invention relates to a tape carrier and a tape carrier device that mounts a semiconductor chip (IC) thereon.

2. Description of Related Art

A semiconductor apparatus is typically formed in the following manner. A semiconductor device is attached to a die pad that is mounted on a lead frame. External electrodes of the semiconductor device and terminals of the lead frame are connected by wires. This structure is packaged by thermosetting resin such as epoxy resin, and then the terminals are cut.

In recent years, electronic apparatuses have been further miniaturized and become thinner. Since semiconductor apparatuses used for these electronic apparatuses are mounted with a higher density, thinner and smaller semiconductor apparatuses are required. To meet such requirements, particular semiconductor apparatuses (tape carrier devices) are used. Typically, a semiconductor chip (IC) is disposed in a device hole defined in a film carrier such as a polyimide film, electrodes of the semiconductor device and inner leads of the carrier film are directly connected to one another, then this structure is printed or potted with a sealing material of liquid resin (for example, epoxy resin).

Conventionally, liquid epoxy resin, such as, for example, Chip Coat 8118 by Namix, Panasealer CV5755 by Matsushita Electronic Co., Ltd., and the like has been used as the sealing material. In the recent miniaturization of the external size of tape carrier devices, a resin sealing region becomes relatively large due to flowing of applied liquid resin with respect to the external size of a tape carrier. As a result, further miniaturization of the size of tape carrier devices is hindered.

A typical conventional tape carrier and a tape carrier device that mounts a semiconductor chip are shown in FIGS. 6A and 6B, respectively. In the figures, reference numeral 7 denotes a device hole, reference numeral 3 denotes an insulating film (base film), reference numeral 8 denotes a copper foil pattern, reference numeral 9 denotes a solder resist for pattern over coat, reference numeral 10 denotes outer leads, reference numeral 2 denotes inner leads, and reference numeral 6 denotes sealing resin for a semiconductor chip.

FIGS. 6A and 6B show a tape carrier for a liquid crystal driver. After the inner leads 2 overhanging on the device hole 7 and electrodes of an IC (semiconductor chip) are connected to one another, the connecting section, a circuit forming surface and a side surface of the semiconductor chip, a gap between the edge of the semiconductor chip and the edge of the device hole and an area outwardly extending from the device hole edge to the tape carrier by about 1.5 mm are covered by, typically, epoxy IC sealing resin 6.

The flow range of the sealing resin 6 is difficult to control because the resin is in the liquid form. In particular, sealing resin printed or dispensed on the tape upper surface flows through the gap between the edge of the semiconductor chip and the edge of the device hole to the rear surface side of the tape. The flow amount thereof is determined by various factors, such as the gap size between the edge of the semiconductor chip and the edge of the device hole which is the most significant factor, coating pressure from above, weight of the resin, viscosity of the resin, capillarity, surface tension of the resin and the like. Therefore, it is extremely difficult to control to restrict the flow amount of the resin and the expansion of the sealing range accompanied with the flowing resin. Accordingly, in the conventional products, a resin flow range outwardly extending from the edge of the device hole to an area on the tape carrier needs to be about 1.5 mm, and it is very difficult to reduce the resin flow range to a smaller value. However, with the reduction of the size of recent tape carrier devices, an occupancy ratio of a resin sealing range has become relatively large with respect the entire size of a tape carrier device, and this limitation of the resin sealing range causes problems such as hinderance of a further reduction of the tape carrier size.

Also, the device hole 7 of the above-described conventional tape carrier device has a configuration shown in FIGS. 7A–7C. FIG. 7A is an expanded view of an area adjacent the device hole, FIG. 7B is a cross-sectional view of one example taken along lines VII—VII of FIG. 7A, and FIG. 7C is a cross-sectional view of another example taken along the same lines VII—VII. In FIGS. 7A–7C, reference numeral 1 denotes a semiconductor chip, reference numeral 2 denotes inner leads, reference numeral 3 denotes a base film, reference numeral 5 denotes a remaining area of the area of the device hole after a semiconductor chip is mounted, which is also a resin passing area through which sealing resin flows to the rear surface side of the tape, and reference numeral 6 denotes a sealing resin.

In the case of the above-described conventional examples, in an area where the pitch of the inner leads 2 is relatively large, the remaining area 5 in the area of the device hole 7 that is left after a semiconductor chip is mounted is very large, and therefore a large amount of the sealing resin 6 flows around to the rear surface side of the base film (tape) 3. As a result, the range of the sealing resin on the rear surface side of the tape becomes larger. Consequently, the mold range has to be set at about 1.5 mm from the edge (end face) of the device hole 7 to a point on the film carrier outside of the edge. If a large amount of the resin flows, as shown in FIG. 7C, the sealing resin 6 may reach the rear surface of the semiconductor chip 1. Control of the sealing range is very difficult and substantially unstable because the resin 6 is in the liquid state. As a result of tests on 20 conventional examples, an average value of sealing ranges on the rear side surface of the tape was 1.2 mm, and the standard deviation of the sealing ranges was 0.2 mm.

Furthermore, even in a tape carrier of the conventional size, the number of terminals at the input side and the number of terminals at the output side of a semiconductor chip for a liquid crystal driver are different from each other. Moreover, when a semiconductor chip has a set of input terminals disposed on one side and a set of output terminals disposed on the opposite side due to the limitation of the circuit, the distance between adjacent terminals on the input side is substantially greater than the distance between adjacent terminals on the output side. As a result, a greater amount of sealing resin flows to the rear surface of the tape at the input side where the terminal-to-terminal distance is greater. To compensate for the resultant thinner sealing resin thickness on the upper surface, a greater amount of sealing resin needs to be coated. As a result, various problems occur. For example, the sealing range expands, and an excessive amount of sealing resin flows to the rear surface of the tape.

SUMMARY OF THE INVENTION

The present invention has been made to solve the above-described problems of the conventional technique. It is an object of the present invention to provide a tape carrier and a tape carrier device in which the flow of sealing resin to the rear surface of the tape is controlled to thereby restrict the resin sealing range, and the external size of the tape carrier and the tape carrier device is reduced.

The above-described object of the present invention is achieved by a tape carrier described below. Namely, in accordance with a first embodiment of the present invention, a tape carrier has an insulating film defining a device hole and wire patterns formed along an upper surface of the insulating film and extending to an interior of the device hole. The tape carrier is characterized in comprising an overhang pattern provided between adjacent ones of the wire patterns, the overhang pattern also extending along an upper surface of the insulating film and protruding to the interior of the device hole and having a specified length less than a length that reaches an end section of a semiconductor chip to be disposed within the device hole.

In accordance with the first embodiment of the present invention thus structured, the overhang patterns are provided between the wire patterns so that even when the wire patterns are widely separated, a sealing resin flow area can be controlled and the sealing resin flowing to the rear side surface of the tape along each edge of a semiconductor chip mounted therein can be controlled to a substantially equal amount. As a result, the flow range outwardly extending to the tape carrier can be readily controlled, the exterior size of the tape carrier can be further miniaturized, and the shape of sealing resin is stabilized. Accordingly, the yield of semiconductor apparatuses (devices) is improved. In addition, the overhang patterns are formed so that tips thereof do not reach the semiconductor chip. As a result, problems that might be caused when the overhang patterns contact the semiconductor chip, such as, for example, short circuit at edges of the semiconductor chip and damage to an active surface of the semiconductor chip, can be avoided.

In accordance with a second embodiment of the present invention, a tape carrier has an insulating film defining a device hole and wire patterns formed from along an upper surface of the insulating film and extending to an interior of the device hole. The tape carrier is characterized in that an overhang pattern is provided adjacent a corner of the device hole in a region where the wire patterns are nonexistent, and the overhang pattern extending from along a top surface of the insulating film to the interior of the device hole has a specified length shorter than reaching an end section of a semiconductor chip to be disposed within the device hole.

In accordance with the second embodiment of the present invention thus structured, overhang patterns are provided in a corner area of the device hole where wire patterns are not normally disposed. The flow amount of sealing resin that is coated in the corner area of the device hole and flows to the rear side surface of the tape can be adjusted to substantially the same flow amount obtained at another area where the wire patterns are provided. Accordingly, the same effect achieved by the first embodiment is obtained.

In each of the above-described embodiments, the overhang pattern can be made wider than the width of the wire pattern. Since the overhang pattern is wide, pattern forming becomes easier. Further, a tip portion of the overhang pattern wider than the wire pattern may be shaped in the form of comb teeth. This will provide substantially the same effect that may be obtained by disposing the wire patterns, and thus the control of sealing resin flow can be performed with high precision.

Further, the distance between the adjacent wire pattern and overhang pattern or the distance between the adjacent overhang patterns is preferably set at 30 to 100 μm. If the distance between the wire pattern and the overhang pattern is smaller than 30 μm, there is a possibility that coated sealing resin does not sufficiently flow to the rear surface of the tape within a predetermined processing time. On the other hand, if the distance between the wire pattern and the overhang pattern is greater than 100 μm, the flow of sealing resin to the rear surface of the tape cannot be sufficiently controlled. As a result, there is a possibility that shapes of hardened sealing resin may substantially vary.

In accordance with a third embodiment of the present invention, a tape carrier has an insulating film and conductor patterns formed thereon by a metal thin film. The tape carrier is characterized in that at least one pair of overhang patterns crossing at right angles is provided at least in a corner section of a device hole to define an alignment mark for disposing the semiconductor chip. Each overhang pattern overhangs on the device hole and has a specified length shorter than it reaches an end section of a semiconductor chip.

In accordance with the third embodiment of the present invention thus structured, excessive flow of sealing resin through a corner area of the device hole to the rear surface of the tape can be restricted, flow of sealing resin toward the peripheral areas of the device hole of the tape carrier can be controlled, and thus variation thereof can be reduced. Also, the overhang patterns that overhang (protrude) in the device hole are used as an alignment mark for disposing a semiconductor chip within the device hole. As a result, the semiconductor chip can be readily and accurately positioned.

In any one of the above-described embodiments, the overhang pattern overhangs in the device hole by an amount that is preferably ⅓ to ¾ of a separation between the semiconductor chip disposed in the device hole and an edge of the device hole.

If the amount of overhang of the overhang patterns is less than one third (⅓) of the above-described separation, the flow of sealing resin to the rear surface of the tape may not be sufficiently controlled. On the other hand, if the amount of overhang of the overhang patterns is greater than three fourth (¾) of the above-described separation, when the semiconductor chip is disposed within the device hole of the tape carrier, the semiconductor chip may be wrongly located, and the semiconductor chip may rotate with respect to the tape carrier. As a result, the overhang pattern may contact the semiconductor chip.

In accordance with a fourth embodiment of the present invention, a tape carrier has an insulating film defining a device hole and wire patterns formed from along an upper surface of the insulating film and extending to an interior of the device hole. The tape carrier is characterized in that the wire patterns include input wire patterns gathered on one side of the device hole and output wire patterns gathered on another sioe of the device hole that is on the opposite side of the one side. The tape carrier is also characterized in that, on the side of the input wire patterns, an overhang pattern, that also extends from along an upper surface of the insulating film to the interior of the device hole and has a specified length shorter than it reaches an edge section of a semiconductor chip to be disposed within the device hole, is provided between adjacent ones of the wire patterns.

In accordance with the fourth embodiment of the present invention thus structured, if a semiconductor chip to be mounted has substantially different separations between wire patterns at the input side and at the output side, such as, for example, a semiconductor chip of driver circuit for a liquid crystal display apparatus (LCD), overhang patterns may be provided between the wire patterns at the input side that have a greater separation. As a result, the flow of sealing resin to the rear side of the tape can be adjusted to approximately the same amount at the input side and the output side, the range of sealing resin flow outwardly extending to the tape carrier is readily controlled, the exterior size of a tape carrier device can be reduced, and the shape of a sealing resin mass is stabilized. As a consequence, the yield of semiconductor apparatuses (devices) is improved. Moreover, the overhang patterns are formed so that the tips of the overhang patterns do not reach the semiconductor chip. As a result, problems that might be caused when the overhang patterns contact the semiconductor chip, such as, for example, short circuit at edges of the semiconductor chip and damage to an active surface of the semiconductor chip, can be avoided.

In accordance with a fifth embodiment of the present invention, a tape carrier device is characterized to include any combination of the wire patterns and overhang patterns defined above, with the wire patterns connecting to a semiconductor chip within the device hole. Since the fifth embodiment thus structured uses a tape carrier in accordance with any one of the above-described embodiments, the size of the tape carrier device is reduced, the yield is improved and thus the cost is reduced.

DETAILED DESCRIPTION OF PREFERRED EMBODIMENTS

Embodiments of the present invention will be described below with reference to the accompanying drawings.

Figure 1A:
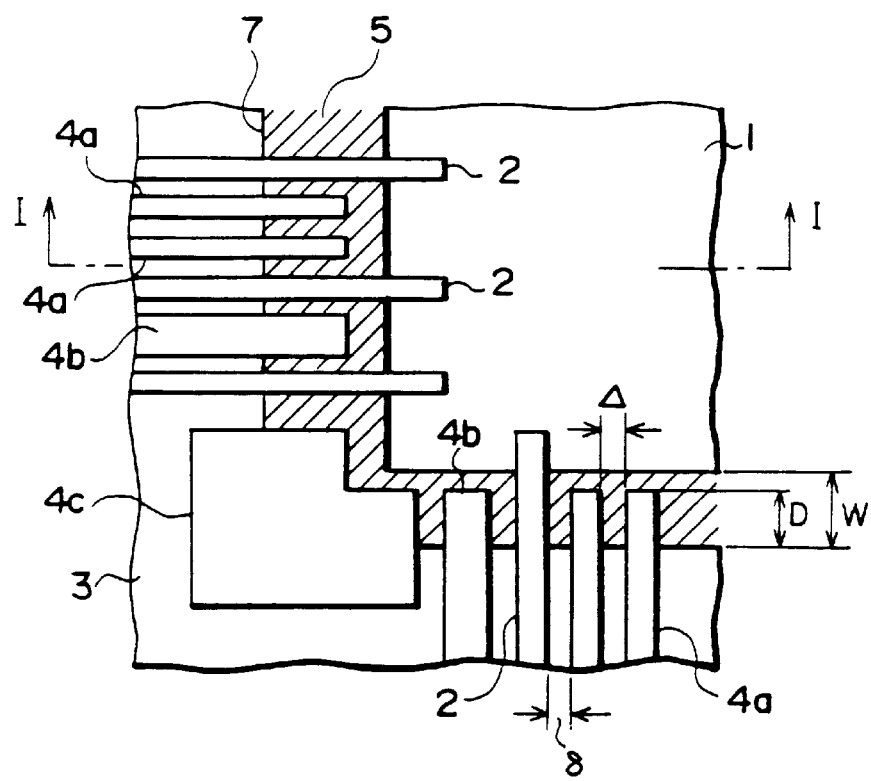
FIG. 1A is an expanded view of a device hole section of a tape carrier device in accordance with a first embodiment of the present invention.
Figure 1B:
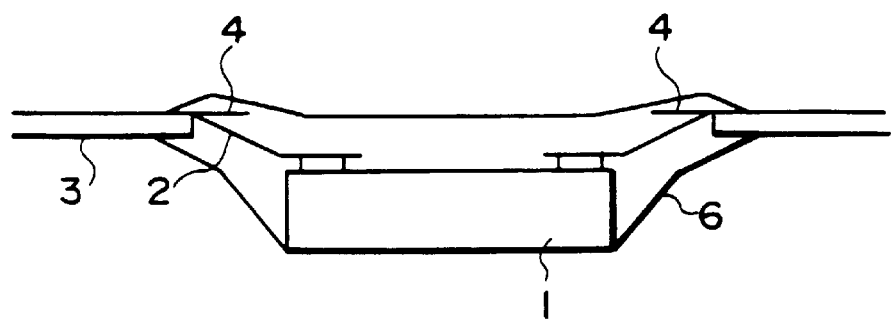
FIG. 1B is a cross-sectional view taken along lines I—I of FIG. 1A.

FIGS. 1A and 1B show a tape carrier device in accordance with a first embodiment of the present invention. FIG. 1A shows an expanded view of a corner section of a device hole section, and shows a state in which a semiconductor chip is mounted. FIG. 1B is a cross-sectional view taken along lines I—I. In FIGS. 1A and 1B, reference numeral 1 denotes a semiconductor chip, reference numeral 2 denotes inner leads defining wire patterns that are formed by patterning a metal thin film such as a copper foil and the like. Reference numeral 3 denotes a base film (preferably, a film that is insulative and flexible), and reference numeral 4 (4a to 4c) denotes overhang patterns formed by a similar process to the wire patterns that overhang over the device hole and have a length shorter than they require to reach an edge section of the semiconductor chip, in accordance with an embodiment of the present invention. A hatched area 5 is a remaining area of the device hole that remains after the semiconductor chip is mounted in the device hole, and that is also a resin passing area through which sealing resin flows to the rear surface of the tape.

In one technique in accordance with an embodiment of the present invention, one or a plurality of the overhang patterns 4, that are shorter than a length that reaches the edge section of the semiconductor chip, are provided in areas where the pitch of the inner leads 2 is relatively large, and in corner areas of the device hole where the inner leads are not provided, depending upon the size of these areas. In the most preferred embodiment, the inner leads 2 that protrude in the device hole are provided in a manner that separations between adjacent ones of the inner leads 2 are equal to one another. In this respect, the inner leads are preferably formed in the same pitch, and the overhang patterns 4 may be used as dummy patterns in an area where connection is not required. However, depending on areas, a different design rule may be applied. For example, when all of the inner leads 2 cannot be formed in the same pitch, at least those inner leads which are disposed (gathered) along one common edge of the device hole 7 are preferably formed in the manner described above. In the figure, the overhang patterns 4 are formed in both areas where the inner leads are disposed in a relatively rough pitch and the inner leads are not provided. However, they may be formed only one of these areas.

In this embodiment, the overhang patterns 4a are formed to have substantially the same width of the inner leads 2, and the overhang patterns 4b are formed to have a width wider than the width of the inner leads 2. Also, the overhang patterns 4 are formed so that the distance $\Delta$ between adjacent ones of the overhang patterns 4 and the distance $\delta$ between the overhang pattern 4 and the inner lead 2 are in a range between 30 and 100 $\mu$m, and the distance $\Delta$ and the distance $\delta$ are approximately the same. The overhang pattern 4c provided in a corner section of the device hole 7 is formed in the shape of a relatively large island with separations from the adjacent inner lead 2 and the adjacent overhang pattern 4b being set at a predetermined value (30 to 100 $\mu$m in this embodiment).

If the distances (gaps) $\Delta$ and $\delta$ are less than 30 $\mu$m, the amount of coated sealing resin 6 flowing to the rear surface of the base film 3 within a predetermined processing time becomes small, with the result that the bonding strength between the semiconductor chip 1 and the base film 3 bonded by the sealing resin 6 may likely be reduced and the flow of the sealing resin 6 to peripheral areas of the device hole 6 may diversify. For example, according to experiments performed by the present inventors, the distance (gap) between the inner lead 2 and the overhang pattern 4 and the flow amount of the sealing resin 6 to peripheral areas of the device hole 6 have a relation shown in FIG. 2.

Sealing resin having a viscosity of 600 poise, that is normally used for the manufacturing process, is used for the sealing resin 6. A mark "o" in the evaluation row in FIG. 2 indicates that the mola shape of the sealing resin 6 is good, a mark "x" indicates that it is defective, and a mark Δ indicates that it may partially be defective.

Figures 2, 3:
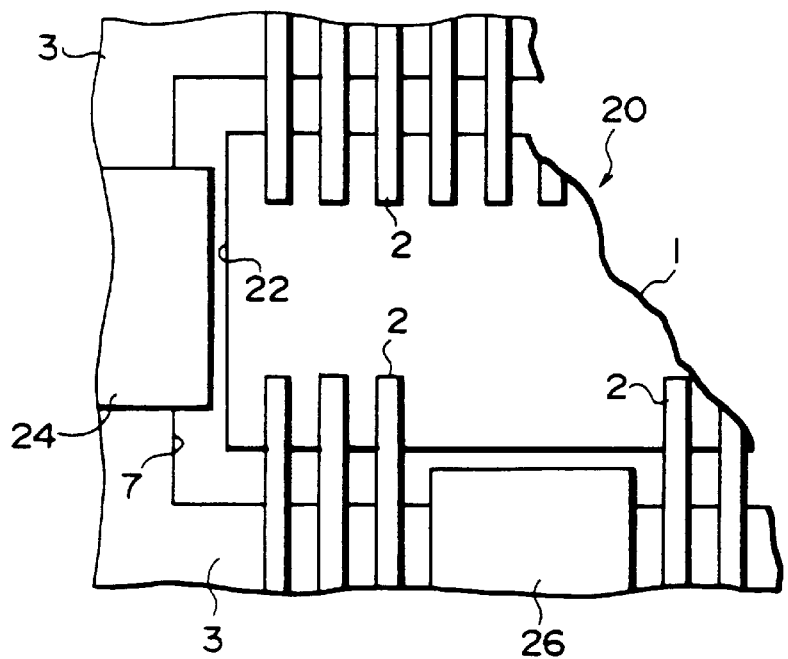
FIG. 2 shows a relationship between distances of inner leads and overhang patterns 4 and the amount of flow of resin outwardly flowing to peripheral areas of the device hole.
FIG. 3 is an explanatory view of a main portion in accordance with a second embodiment of the present invention.

As shown in FIG. 2, the gap smaller than 30 μm results in a greater diversification and a higher likelihood of defects in the mold shape. Also, the same thing happens when the gap is about 100 μm or greater. Therefore, the gaps Δ and δ are preferably set at a value between 30 μm and 100 μm.

On the other hand, the amount of each overhang 4 (the amount of protrusion) protruding from the base film 3 to the device hole 7 is preferably set at ⅓ to ¾ of a separation between the edge of the semiconductor chip 1 and the edge of the device hole 7. For example, when the distance between the edge of the semiconductor chip and the edge of the device hole 7 is W as shown in FIG. 1A, the amount of overhang of the overhang pattern D is ⅓ W to ¾ W.

When D is smaller than ⅓ W, the effect provided by the overhang 4 is small and the mold shapes would likely diversify. When D is greater than ¾ W, when the semiconductor chip 1 is disposed within the device hole 7, the overhang pattern 4 may contact the semiconductor chip due to a divergence in the location or a rotation of the semiconductor chip. As a result, a short circuit at the edge may occur or an active surface of the semiconductor chip 1 may be damaged.

In the tape carrier device thus formed, the sealing resin 6 is restricted from flowing to the rear surface of the tape. Also, because this is a mechanical implementation, the resin sealing range is stably controlled. According to the results obtained by performing the present embodiment, an average of resin sealing ranges on the rear surface of the tapes (distances measured from the edge of the device hole) of twenty samples is 0.8 mm and a standard deviation from this average is 0.06 mm.

Accordingly, unnecessary expansion of the sealing resin range and diversification in the position thereof due to conventionally uncontrollable sealing resin range are prevented. As a result, the stability of product shapes is substantially improved, and further miniaturization of tape carries, that is required by the ever increasing density of electronic apparatuses, is achieved.

Further, in accordance with the present invention, a tape carrier is characterized in that one or a plurality of overhang patterns, each overhanging over a device hole and being shorter than a length that reaches an edge of a semiconductor chip, is provided in an area between adjacent inner leads or a corner area of the device hole where inner leads are not provided. As a result, the orientation of a semiconductor device and the material and structure of component members of the semiconductor device are readily changed.

FIG. 3 shows an explanatory view of a main section of a tape carrier device in accordance with a second embodiment of the present invention. In a tape carrier device 20 in accordance with this embodiment, a semiconductor chip 1 has an edge 22 where electrodes are not provided, for example, in the case of a drive circuit for LCD, and a portion of the base film 3 corresponding to the edge 22 is not provided with inner leads 2. In this embodiment, a wide overhang pattern 24 is provided in the portion opposing the edge 22. Also, a wide overhang pattern 26 is provided in a widely separated area between adjacent inner leads 2. By providing these overhang patterns 24 and 26, effects similar to those of the above-described embodiment are obtained.

Figure 4:
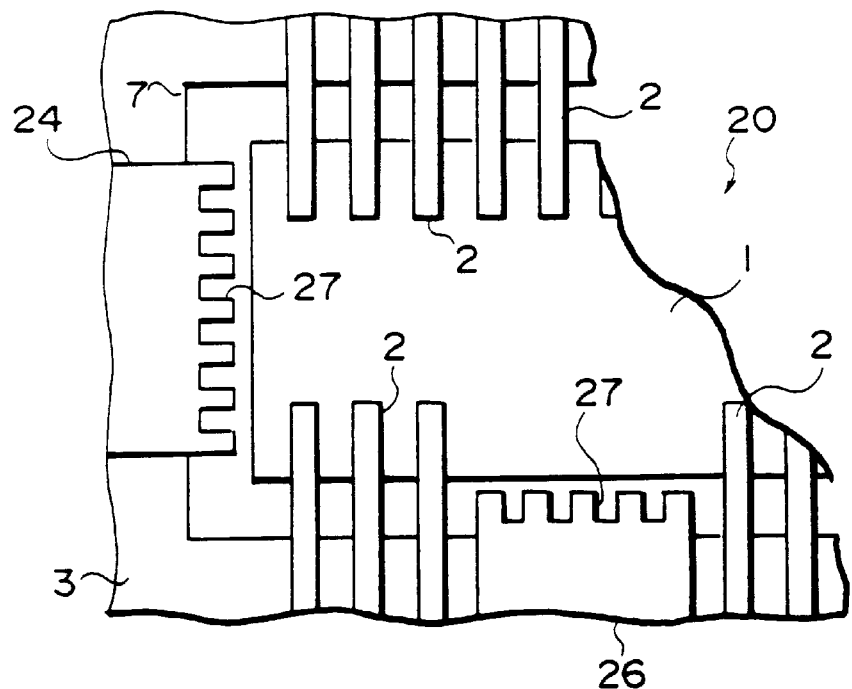
FIG. 4 is an explanatory view of a main portion in accordance with a third embodiment of the present invention.

FIG. 4 shows an explanatory view of a main portion of a third embodiment of the present invention. In accordance with this embodiment, wide overhang patterns 24' and 26', that overhang (protrude) over a device hole 7, have tip portions formed with a plurality of notches 27 defining comb-teeth tip portions. The width, depth and pitch of the notches 27 are appropriately decided based on the sealing resin 6 to be coated, the pitch of the inner leads 2 and the like. As a result, the resin flow control is more effectively carried out.

Figure 5:
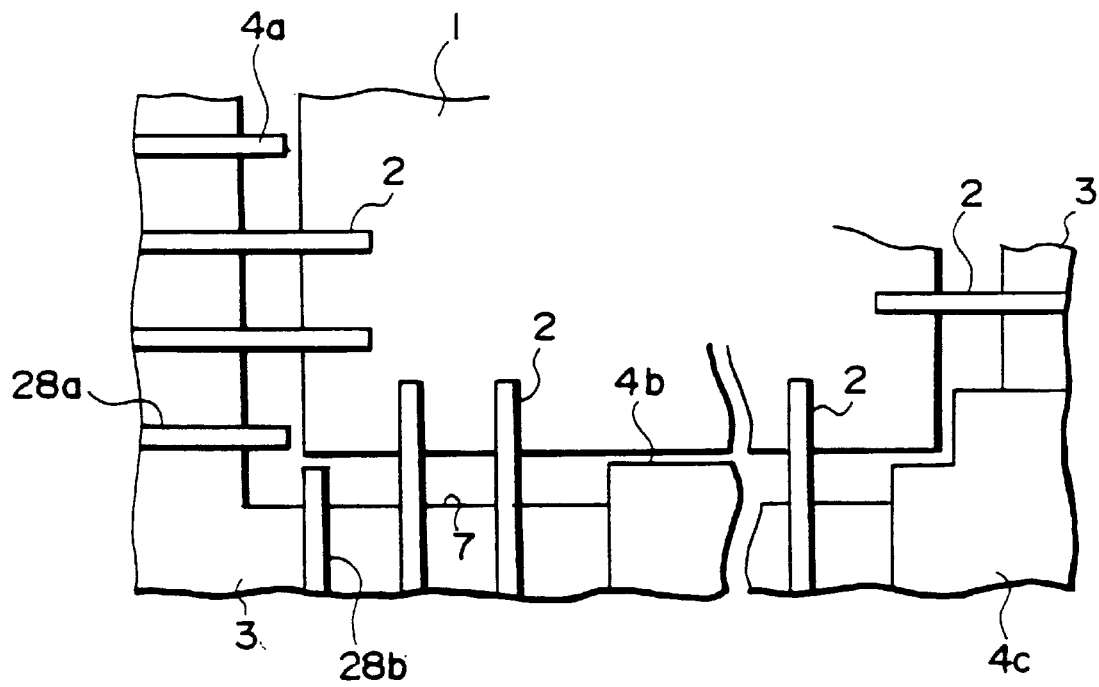
FIG. 5 is an explanatory view of a main portion in accordance with a fourth embodiment of the present invention.
Figure 6A:
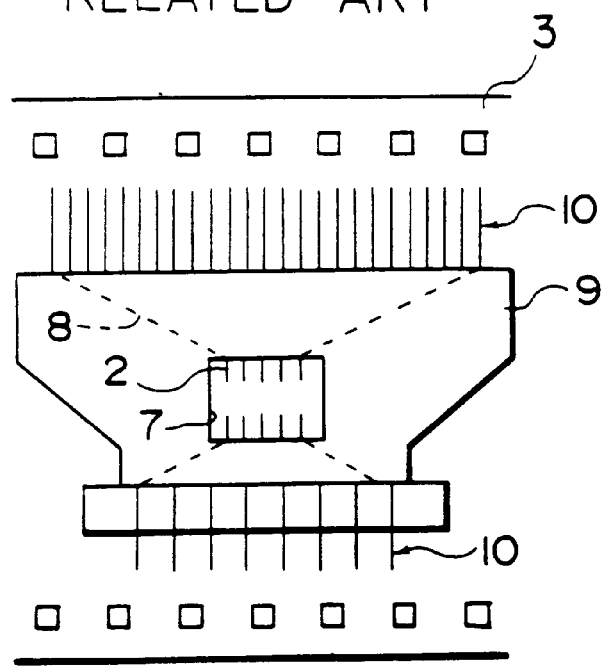
FIG. 6A illustrates a conventional tape carrier.
Figure 6B:
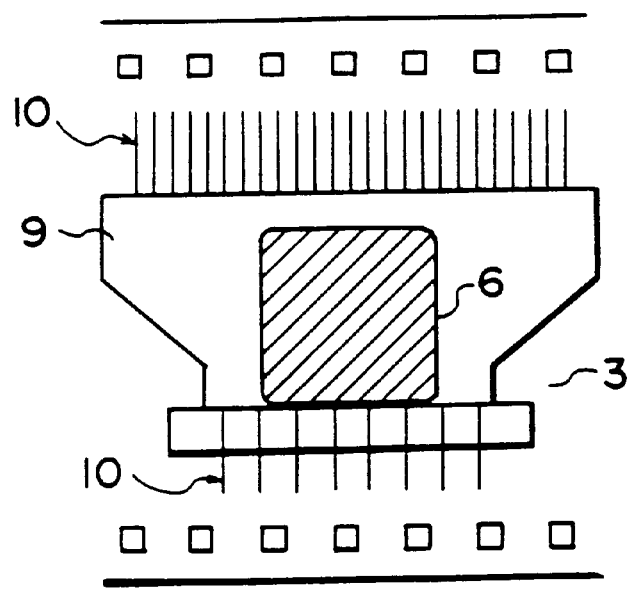
FIG. 6B illustrates a conventional tape carrier device.
Figure 7A:
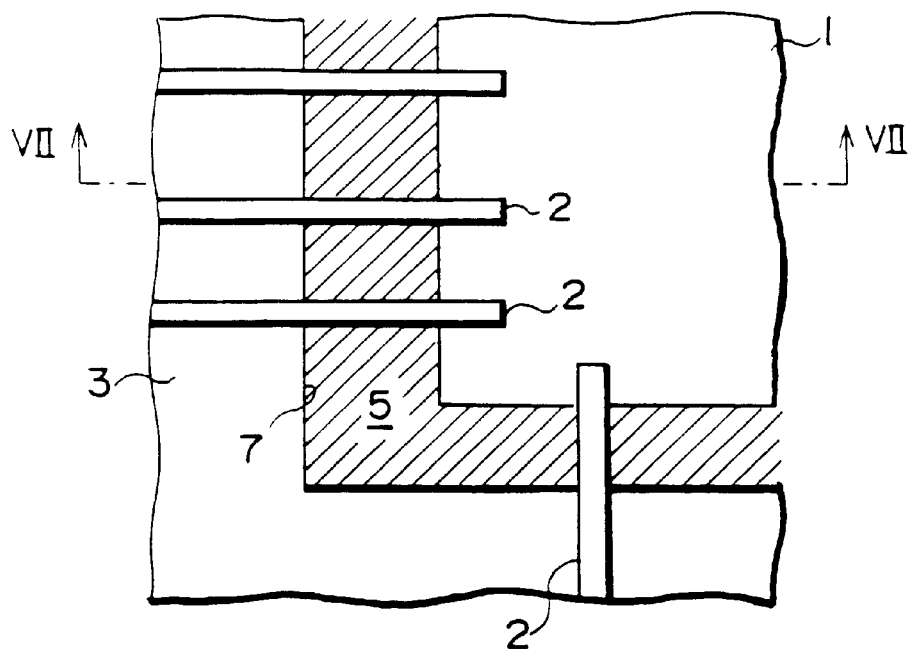
FIG. 7A is an expanded view of a device hole section of a conventional tape carrier device.
Figure 7B:
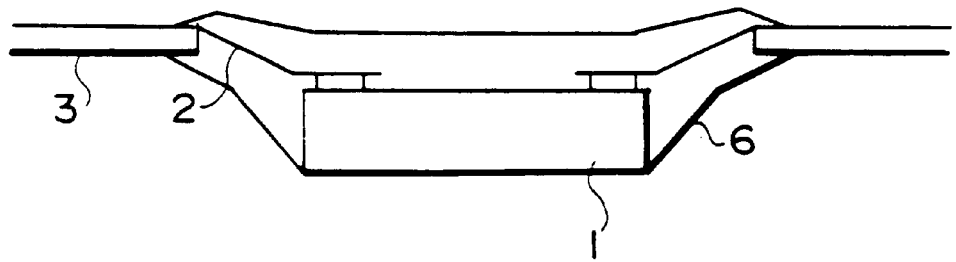
FIG. 7B is a cross-sectional view of an example taken along lines VII—VII of FIG. 7A.
Figure 7C:
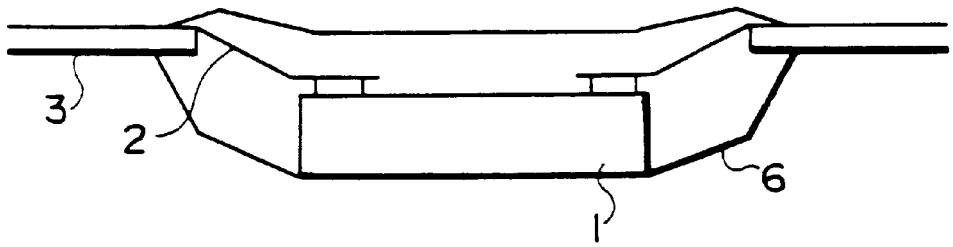
FIG. 7C is a cross-sectional view of another example taken along lines VII—VII of FIG. 7A.

FIG. 5 shows an explanatory view of a main portion of a fourth embodiment of the present invention. In accordance with this embodiment, in a corner area of a device hole 7 where no inner leads are provided, a pair of overhang patterns 28a and 28b are disposed in a manner that they are aligned with right-angled coordinates. The overhang patterns 28a and 28b control the flow of sealing resin 6 that reaches the rear surface of the base film 3 through the area where no inner lead 2 is provided, and are also used as an alignment mark to be used when a semiconductor chip 1 is mounted in the device hole 7. By using the overhang patterns 28a and 28b that protrude in the device hole 7 as an alignment mark, the semiconductor chip 1 is more accurately positioned.

It is noted that the overhang patterns 28a and 28b may be provided at each of the four corners of the device hole 7. Alternatively, they may be provided at each of two diagonally opposing corners, and an overhang pattern 4c, that is not used as an alignment mark as shown in FIG. 5, may be provided at each of the other two diagonally opposing corners.

As described above, a tape carrier in accordance with the present invention enables reduction of sealing resin ranges and improvement of the position stability of sealing resin ranges. As a result, various effects are obtained. For example, the shape of products becomes uniform, and thus reliability of products is improved and the size of products is reduced.

What is claimed is:

1. A tape carrier for mounting a semiconductor chip, comprising:

an insulating film defining a device hole for receiving the semiconductor chip;

a plurality of wire patterns connecting to the semiconductor chip, the wire patterns extending from along a surface of the insulating film to an interior of the device hole, the wire patterns provided in other areas than an area at a corner of the device hole; and an overhang pattern provided at the corner of the device hole, the overhang pattern extending from along the surface of the insulating film to the interior of the device hole and having a length that is less than a length that would reach an outer periphery of the semiconductor chip within the device hole.

2. The tape carrier according to claim 1, wherein the overhang pattern has a width that is wider than a width of at least one of the wire patterns as measured in a direction substantially perpendicular to a direction the overhang pattern extends to the interior of the device hole.

3. A tape carrier device comprising the tape carrier according to claim 2 for receiving the semiconductor chip and a resin sealing at least an area between the insulating film and the semiconductor chip.

4. The tape carrier according to claim 1, wherein the overhang pattern includes an end portion extending into the device hole, the end portion defining a plurality of notches across the width of the overhang pattern to form a comb pattern.

5. The tape carrier according to claim 1, wherein a length of a portion of the overhang pattern extending from an interior periphery of the device hole is approximately ⅓ to ¾ of the entire distance between the outer periphery of the semiconductor chip within the device hole and the inner periphery of the device hole.

6. A tape carrier device comprising the tape carrier according to claim 5 for receiving the semiconductor chip and a resin sealing at least an area between the insulating film and the semiconductor chip.

7. A tape carrier device comprising the tape carrier according to claim 1 for receiving the semiconductor chip and a resin sealing at least an area between the insulating film and the semiconductor chip.

8. A tape carrier for mounting a semiconductor chip, comprising:

an insulating film defining a device hole for receiving the semiconductor chip;

a plurality of leads consisting of a plurality of wire patterns and at least one overhang pattern, the wire patterns connecting to the semiconductor chip, the overhang pattern having a length that is less than a length that would reach an outer periphery of the semiconductor chip within the device hole, the leads extending from along a surface of the insulating film to an interior of the device hole, the leads disposed along one common edge of the device hole and formed in the same pitch.

9. The tape carrier according to claim 8, wherein the overhang pattern includes an end portion extending into the device hole, the end portion defining a plurality of notches across the width of the overhang pattern to form a comb pattern.

10. The tape carrier according to claim 8, wherein a gap width between each of the wire patterns and the overhang pattern is in the range of approximately 30 μm to 100 μm.

11. The tape carrier according to claim 8, wherein a length of a portion of the overhang pattern extending from an interior periphery of the device hole is approximately ⅓ to ¾ of the entire distance between the outer periphery of the semiconductor chip within the device hole and the inner periphery of the device hole.

12. A tape carrier device comprising the tape carrier according to claim 11 for receiving the semiconductor chip and a resin sealing at least an area between the insulating film and the semiconductor chip.

13. A tape carrier device comprising the tape carrier according to claim 8 for receiving the semiconductor chip and a resin sealing at least an area between the insulating film and the semiconductor chip.

14. A tape carrier for mounting a semiconductor chip, comprising:

an insulating film defining a device hole for receiving the semiconductor chip;

a plurality of wire patterns connecting to the semiconductor chip, the wire patterns extending from along a surface of the insulating film to an interior of the device hole, the wire patterns provided in other areas than a portion opposing at least one of the edges of the semiconductor chip; and at least one overhang pattern provided at the portion where the wire patterns are not provided, the overhang pattern extending from along the surface of the insulating film to the interior of the device hole and having a length that is less than a length that would reach an outer periphery of the semiconductor chip within the device hole.

15. The tape carrier according to claim 14, wherein the overhang pattern has a width that is wider than a width of at least one of the wire patterns as measured in a direction substantially perpendicular to a direction the overhang pattern extends to the interior of the device hole.

16. The tape carrier according to claim 14, wherein the overhang pattern includes an end portion extending into the device hole, the end portion defining a plurality of notches across the width of the overhang pattern to form a comb pattern.

17. The tape carrier according to claim 14, wherein a length of a portion of the overhang pattern extending from an interior periphery of the device hole is approximately ⅓ to ¾ of the entire distance between the outer periphery of the semiconductor chip within the device hole and the inner periphery of the device hole.

18. A tape carrier device comprising the tape carrier according to claim 17 for receiving the semiconductor chip and a resin sealing at least an area between the insulating film and the semiconductor chip.

19. The tape carrier according to claim 14, comprising a plurality of the overhang patterns, wherein a gap width between the adjacent ones of the overhang patterns is in the range of approximately 30 μm.

20. A tape carrier device comprising the tape carrier according to claim 14 for receiving the semiconductor chip and a resin sealing at least an area between the insulating film and the semiconductor chip.

* * * * *